United States Patent [19]

Hanbury et al.

[11] Patent Number: 4,901,283

[45] Date of Patent: Feb. 13, 1990

[54] DYNAMIC RANDOM-ACCESS MEMORY SYSTEM WITH POWER-UP AND POWER-DOWN REFRESH CIRCUITS

[75] Inventors: Jonathan M. Hanbury; Keith Burton, both of Bracknell, Great Britain

[73] Assignee: International Computers Limited, London, England

[21] Appl. No.: 266,391

[22] Filed: Nov. 2, 1988

[30] Foreign Application Priority Data

Jan. 22, 1988 [GB] United Kingdom ................. 8801472

[51] Int. Cl.⁴ .................... G11C 7/00; G06F 12/16
[52] U.S. Cl. .................... 365/222; 364/900; 364/934.71; 364/945.3; 364/948.1; 364/948.5; 364/950.5; 364/964.9; 364/965.78
[58] Field of Search ................. 365/222, 228, 229; 364/707, 200 MS File, 900 MS File

[56] References Cited

U.S. PATENT DOCUMENTS

| | | |
|---|---|---|
| 4,313,180 | 1/1982 | Mochizuki et al. ............... 365/222 |
| 4,316,248 | 2/1982 | Retter ............................... 364/200 |
| 4,616,346 | 10/1986 | Nakaizumi et al. ............ 365/229 X |
| 4,625,296 | 11/1986 | Shriver ............................. 364/900 |
| 4,631,701 | 12/1986 | Kappeler .......................... 364/900 |
| 4,701,843 | 10/1987 | Cohen .............................. 364/200 |
| 4,754,425 | 6/1988 | Bhadriraju ....................... 364/900 |

FOREIGN PATENT DOCUMENTS 60-237522 11/1985 Japan ................................. 364/707

Primary Examiner—Archie E. Williams, Jr.
Assistant Examiner—Munteanu-R. Florin
Attorney, Agent, or Firm—Lee, Mann, Smith, McWilliams & Sweeney

[57] ABSTRACT

A dynamic random-access memory (DRAM) has a first refresh circuit for producing memory refreshes during power-up, and a second refresh circuit for producing memory refreshes during power-down. The power-down refresh circuit is powered by a battery, and has a lower power consumption than the power-up circuit. During transition from power-down to power-up, the frequency of refreshing is doubled for a short period, so as to build up a surplus of refreshes. This allows refreshing to stop while the first or power-up refresh circuit is brought back into operation.

5 Claims, 2 Drawing Sheets

DYNAMIC RANDOM-ACCESS MEMORY SYSTEM WITH POWER-UP AND POWER-DOWN REFRESH CIRCUITS

BACKGROUND TO THE INVENTION

This invention relates to dynamic random-access memories (DRAMS).

In a DRAM, the contents of the memory gradually decay, and it is necessary to refresh the memory periodically in order to preserve its contents. This normally involves cycling through the memory and performing a read/write operation on each location of the memory in turn. Typically, each location must be refreshed every 4 milliseconds.

If the system in which the DRAM is used is switched off (powered down), then the contents of the DRAM may be lost. This can be avoided by providing some form of battery back-up for the memory, so that refreshing can continue even when the system is powered down.

It has been proposed to provide a dynamic random-access memory having a first refresh circuit for producing memory refresh cycles during a power-up condition, and a second refresh circuit for producing memory refresh cycles during a power-down condition and having a lower power requirement than the first refresh circuit. This enables the power requirements in the power-down conditions to be reduced, so as to avoid excessive drain on the battery.

When two refresh circuits are used in this way, it is necessary to switch between the two circuits when power is removed or restored. A problem arises in that, when power is restored, it is necessary to bring the power-up refresh circuit into operation quickly, to avoid loss of data. This may be difficult to achieve, since it may be necessary for a system processor to initialise the power-up refresh circuit before it can begin to operate.

SUMMARY OF THE INVENTION

According to the invention there is provided a dynamic random-access memory having a first refresh circuit for producing memory refresh cycles during a power-up condition, a second refresh circuit for producing memory refresh cycles during a power-down condition and having a lower power requirement than the first refresh circuit, and means operative during transition from the power-down condition to the power-up condition for temporarily increasing the frequency of the refresh cycles by the second refresh circuit, thereby providing a period in which no refresh cycles are required, to allow time for the first refresh circuit to become operative.

By increasing the frequency of the second refresh circuit during the transition, it is possible to build up a surplus of refreshes. This enables the memory to be left for a short period without any refreshes, while the first refresh circuit comes back into operation.

In one embodiment of the invention, the frequency of the first refresh circuit is increased for a short period after the transition. This further ensures that each location of the memory is refreshed within the prescribed cycle time.

BRIEF DESCRIPTION OF THE DRAWINGS

One embodiment of the invention will now be described by way of example with reference to the accompanying drawings.

DESCRIPTION OF AN EMBODIMENT OF THE INVENTION

Figure 1:
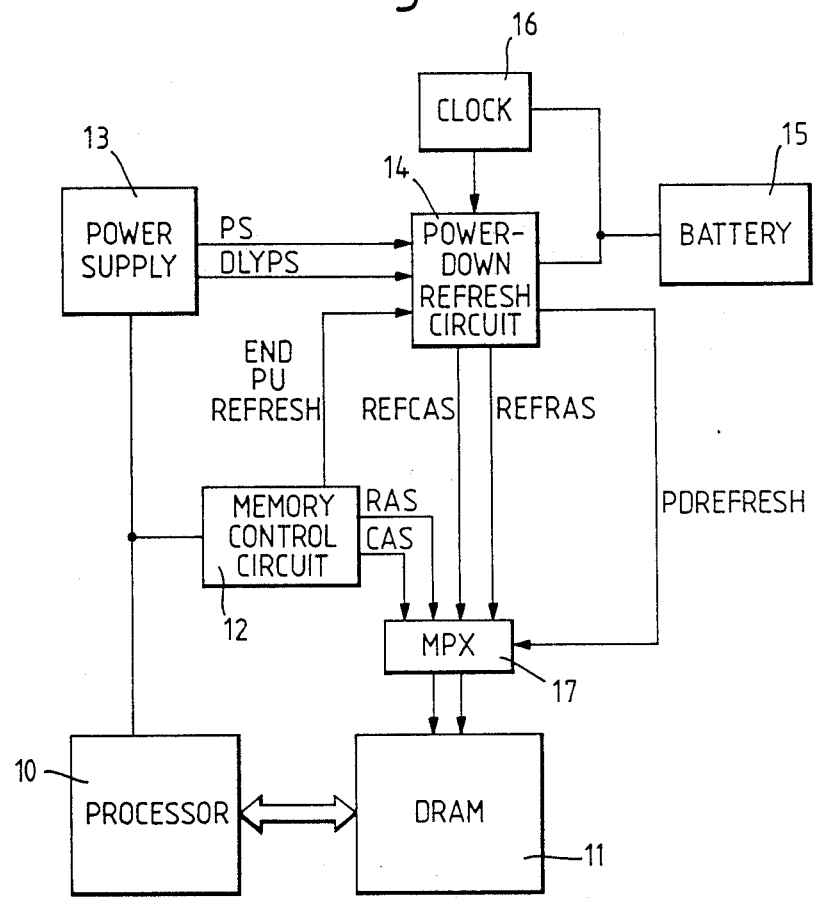
FIG. 1 is a block diagram of a data processing system including a dynamic random-access memory (DRAM), with power-up and power-down refresh circuits.

Referring to FIG. 1, the system comprises a processor 10, connected to a DRAM 11 so that the processor can read and write data in a conventional manner.

The DRAM 11 in this example holds 256K bytes, organised in 1024 rows and 256 columns. The DRAM has a memory control circuit 12, which may be of conventional form, for producing the normal row address strobe (RAS) and column address strobe (CAS) signals for the memory.

The system also includes a power supply unit 13, for supplying power to the processor, DRAM, and memory control circuit.

When the system is powered up (i.e. when the power supply 13 is operating) the memory control circuit 12 performs periodic refresh operations on the DRAM. Each refresh cycle consists of applying a CAS and then a RAS to the memory, i.e. reversing the normal order of RAS then CAS. This causes one selected column of the memory to be refreshed. The refresh cycle is performed for a different column every 15.625 microseconds, which means that the whole memory is refreshed every 4 milliseconds. This ensures that the memory contents are preserved.

The control circuit 12 is conveniently implemented as a plurality of integrated-circuit gate arrays, and hence has a relatively high power requirement.

When the system is powered down, the DRAM is refreshed by a power-down refresh circuit 14, powered by a back-up battery 15. The power-down refresh circuit comprises a single CMOS chip, and hence consumes only a relatively small amount of power.

The power-down refresh circuit 14 receives a 512 KHz clock signal CLK from a clock circuit 16, which is also powered by the battery 15.

The power supply 13 produces two control signals PS and DLYPS, to indicate its current state. PS is true (high) when the power supply is operating normally. When the power supply is switched off, the signal PS goes false (low) before the supply voltage falls out of specification. When the power supply is switched on again, the signal PS goes true after the supply voltages are back within specification. DLYPS follows PS after a delay of greater than 2 milliseconds.

The control circuit 12 produces a control signal END PU REFRESH CYCLE to indicate the end of each power-up refresh cycle. This signal is fed to the power-down refresh circuit 14.

The system also includes a muliplexer 17, which normally selects the signals RAS and CAS from the memory control circuit 12 for application to the DRAM. When this multiplexer is switched, as will be described below, it selects alternative signals REFRAS and REFCAS from the power-down refresh circuit 14.

The power-down refresh circuit 14 comprises two parts, referred to herein as the power-down/power-up control and the refresh control. Each of these parts is impemented in the form of a state machine, as defined by the state diagrams of FIGS. 2 and 3 respectively.

The power-up/power-down control (FIG. 2) comprises three states 21–23, referred to hereinafter as states A-C. The refresh control (FIG. 3) comprises eight states 31–38, referred to hereinafter as states K-S.

The power-down/power-up control (FIG. 2) communicates with the refresh control (FIG. 3) by means of the following signals:

PD REFRESH. This enables the refresh control. As shown in FIG. 1, this signal also controls the multiplexer 17, so that when PD REFRESH is true, the signals REFRAS and REFCAS are routed to the DRAM in place of the normal RAS and CAS.

DOUBLE REFRESH RATE. This causes the refresh control to double the refresh rate.

The refresh control communicates with the power-down/power-up control by means of the following signal:

END PD REFRESH CYCLE. This indicates that the current power-down refresh cycle is complete.

Figure 2:
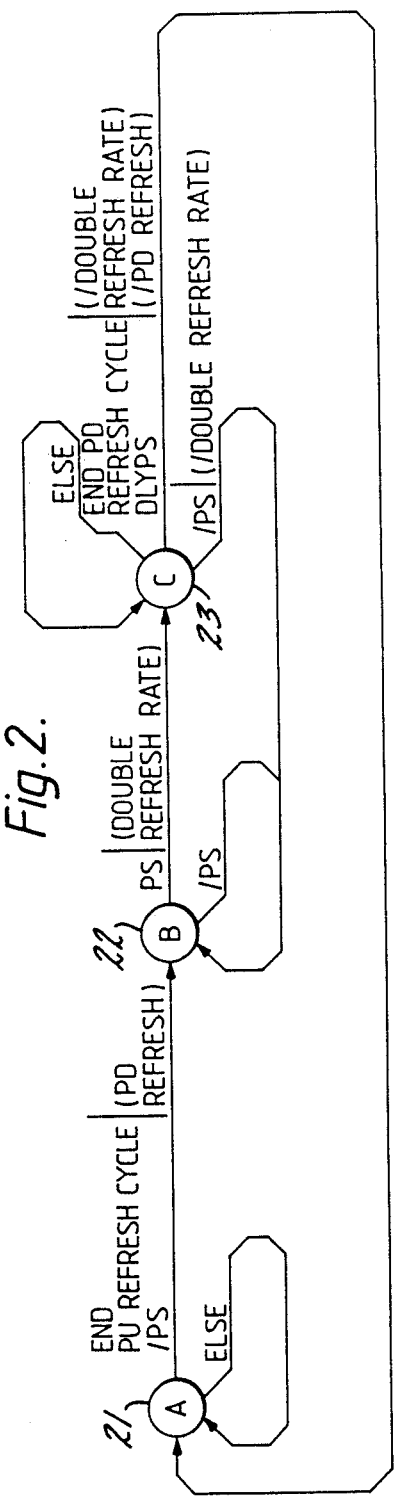
FIGS. 2 and 3 are state diagrams describing the power-down refresh circuit.
Figure 3:
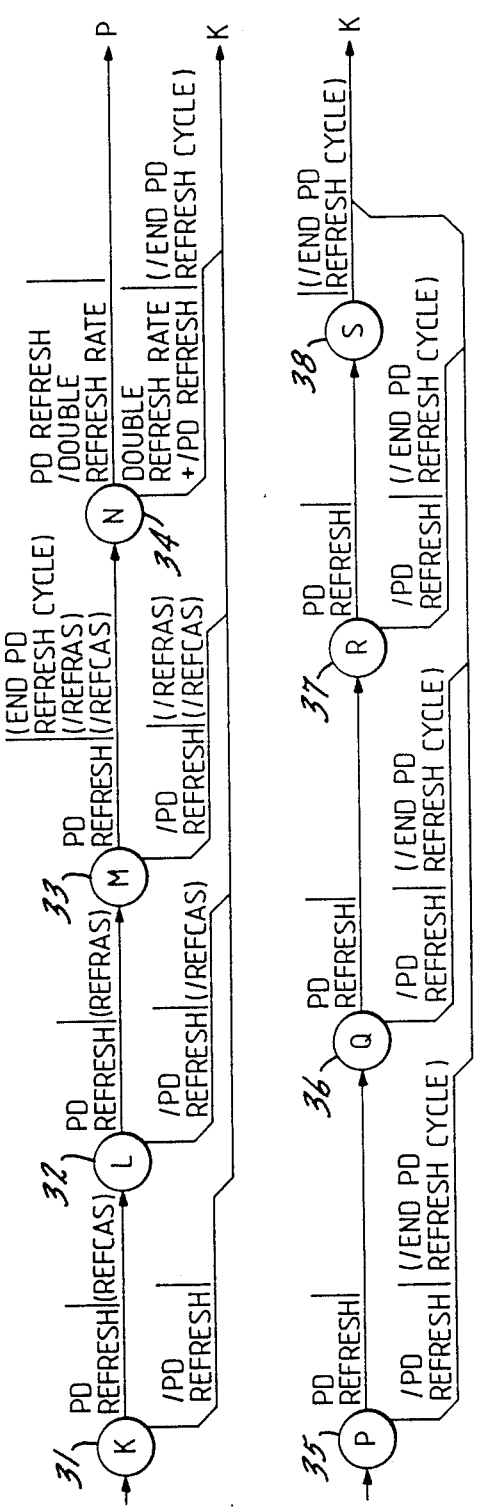

In the state diagrams of FIGS. 2 and 3, each state is represented by a circle, and a transition between states is represented by an arrow. Each arrow is labelled with one or more conditions which must be satisfied before the transition can take place, followed (in brackets) by output signals that are effected by the transition.

For example, in FIG. 2, the arrow from state A to state B is labelled with the conditions END PU REFRESH CYCLE and /PS (where / denotes negation). Thus, if the state machine is in state A, then it will make the transition to state B at the first clock edge after these conditions are both satisfied. At the same time, the output PD REFRESH goes true. If, on the other hand, these two conditions are not both satisfied, then the state machine remains in state A and PD REFRESH remains false.

The operation of the two state machines will now be described.

In the power-down condition, PS is false. This causes the power-down/power-up control (FIG. 2) to enter state B and to remain there, with DOUBLE REFRESH RATE false and PD REFRESH true. At the same time, the refresh control (FIG. 3) cycles through the eight states K-S at successive clock beats, producing one REF CAS and one REF RAS in each cycle. Thus, in this condition, a refresh cycle is performed at every eighth clock beat, i.e. every 15.625 microseconds.

When the system is powered up, the signal PS goes true. At the next clock beat, the power-down/power-up control goes from state B to state C, and DOUBLE REFRESH RATE goes true. This signal causes the refresh control to loop back from state N to state K, so that it now cycles through the four states K-N, again producing a REFCAS and a REFRAS in each cycle. Thus, in this condition, a refresh cycle is produced every 7.812 microseconds, so that the refresh rate is doubled.

After 2 milliseconds, the signal DLYPS goes true. Then, at the first clock beat after END PD REFRESH CYCLE becomes true, the power-down/power-up control goes from state C to state A, and DOUBLE REFRESH RATE and PD REFRESH both become false. At the same time, the refresh control goes from state N to state K, and END PD REFRESH becomes false. PD REFRESH causes the processor 10 to come out of reset, and switches the multiplexer 17 (FIG. 1) so as to connect the normal control signals RAS and CAS to the memory.

The state machines remain in states A and K respectively, until the next power-down.

After the processor 10 has come out of reset the memory control circuit 12, under the control of software, doubles the refresh rate for a period of 2 milliseconds after which it reverts back to its normal rate. This ensures that those columns of memory refreshed at the beginning of the power-down refresh cycle are refreshed within 4 milliseconds of their last refresh.

In summary, it can be seen that, when the system is powered-up, the refresh rate of the power-down refresh control 14 is doubled for 2 milliseconds before the processor comes out of reset. This builds up a surplus of refresh cycles, such that the DRAM does not have to be refreshed again for another 2 milliseconds. This allows time for the processor to initialise the memory control circuit 12, so as to allow it to start performing refresh cycles again.

By also doubling the refresh rate after the processor has come out of reset it is ensured that every column of the memory is refreshed within 4 milliseconds of its last refresh.

What is claimed is:

1. A dynamic random-access memory system comprising:
    (a) a dynamic random-access memory,
    (b) means for generating control signals defining a power-down condition, a transition condition, and a power-up condition,
    (c) a power-down refresh circuit, responsive to said control signals, for producing a series of refresh signals at a first predetermined frequency in the power-down condition and at a second predetermined frequency in the transition condition, the second predetermined frequency being higher that the first predetermined frequency,
    (d) a power-up refresh circuit for producing a series of refresh signals in the power-up condition, the power-up refresh circuit having a higher power requirement than the power-down refresh circuit, and
    (e) selection means, responsive to said control signals, for selecting refresh signals from the power-down refresh circuit to determine refresh cycles for the memory during the power-down condition and the transition condition, and for selecting refresh signals from the power-up refresh circuit to determine refresh cycles for the memory during the power-up condition.

2. A system according to claim 1 further including means for operating the power-up refresh circuit to produce refresh signals at said second predetermined frequency for a predetermined time period upon commencement of said power-up condition, and means for operating the power-up refresh circuit to produce refresh signals at said first predetermined frequency following said predetermined time period.

3. A system according to claim 1 wherein said second predetermined frequency is twice said first predetermined frequency.

4. A method of operating a dynamic random-access memory system comprising a dynamic random-access memory, a main power supply, a back-up power supply, a power-up refresh circuit, and a power-down refresh circuit having a lower power requirement than the power-up refresh circuit, the method comprising:

(a) operating the system in a power-down condition in which the main power supply is inactive and the power-down refresh circuit receives power from the back-up power supply, (b) in the power-down condition, operating the power-down refresh circuit to supply refresh signals to the memory at a first predetermined frequency, to determine refresh cycles for the memory, (c) activating the main power supply, (d) during a first transitional period following activation of the main power supply, operating the power-down refresh circuit to supply refresh signals to the memory at a second predetermined frequency, higher than the first predetermined frequency, (e) during a second transitional period following said first period, initializing said power-up refresh circuit, without supplying any refresh signals to the memory, (f) during a third transitional period, following the second period, operating the power-up refresh circuit to supply refresh signals to the memory at said second predetermined frequency, and (g) following said third period, operating the system in a power-up condition, in which the power-up refresh circuit supplies refresh signals to the memory at said first predetermined frequency.

5. A method according to claim 4 wherein said second predetermined frequency is twice said first predetermined frequency.

* * * * *